US006246122B1

(12) United States Patent
Lin

(10) Patent No.: US 6,246,122 B1
(45) Date of Patent: Jun. 12, 2001

(54) ELECTROSTATIC DISCHARGE PROTECTIVE SCHEMES FOR INTEGRATED CIRCUIT PACKAGES

(75) Inventor: Shi-Tron Lin, Taipei (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/345,128

(22) Filed: Jul. 6, 1999

Related U.S. Application Data

(63) Continuation-in-part of application No. 09/198,876, filed on Nov. 24, 1998, now Pat. No. 6,025,631, which is a continuation of application No. 08/677,109, filed on Jul. 9, 1996, now Pat. No. 5,869,870.

(51) Int. Cl.$^7$ .................................................. H01L 23/48
(52) U.S. Cl. .............................. 257/786; 257/355; 361/56
(58) Field of Search ..................................... 257/786, 356, 257/355, 357, 360, 361, 546; 361/19, 54, 56

(56) References Cited

U.S. PATENT DOCUMENTS

| 4,692,781 | 9/1987 | Rountree et al. ................. 357/23.13 |
| 5,229,635 | * | 7/1993 | Bessolo et al. ....................... 257/357 |
| 5,512,783 | 4/1996 | Wakefield et al. ..................... 257/693 |
| 5,623,387 | 4/1997 | Li et al. .................................... 361/56 |
| 5,646,434 | * | 7/1997 | Chrysostomides et al. .......... 257/355 |
| 5,712,753 | 1/1998 | Yeh et al. ................................ 361/56 |
| 5,715,127 | 2/1998 | Yu ........................................... 361/56 |
| 5,818,086 | 10/1998 | Lin et al. .............................. 257/355 |

OTHER PUBLICATIONS

Matsumoto, et al., "New Failure mechanism due to Non-Wired Pin ESD Stressing", EOS/ESD Symposium 1994, pp. 2.5.1–2.5.6.

* cited by examiner

Primary Examiner—Don Wong
Assistant Examiner—Thuy Vinh Tran
(74) Attorney, Agent, or Firm—Raymond Sun

(57) ABSTRACT

An ESD protective device for protection of an integrated circuit (IC) package from electrostatic discharge damage. The ESD protective device protects the internal circuit of the IC connected to wired pins of the IC package against ESD damage due to ESD stress in neighboring no-connect pins. The ESD protective device includes an ESD protective unit coupled to the power bus and a bonding pad coupled between this ESD protective device and the no-connect pin. The ESD protective unit causes ESD stress applied to the no-connect pin to be diverted to the power bus, thus preventing ESD transfer between a no-connect pin and an active pin, which could damage the internal circuit.

24 Claims, 14 Drawing Sheets

ELECTROSTATIC DISCHARGE PROTECTIVE SCHEMES FOR INTEGRATED CIRCUIT PACKAGES

RELATED CASES

This is a continuation-in-part of Ser. No. 09/198,876, entitled "Electrostatic Discharge (ESD) Protective Device For Integrated Circuit Packages With No-Connect Pins", filed Nov. 24, 1998, now U.S. Pat. No. 6,025,631, which is in turn a continuation of Ser. No. 08/677,109, entitled "Electrostatic Discharge (ESD) Protective Device For Integrated Circuit Packages With No-Connect. Pins", filed Jul. 9, 1996, now U.S. Pat. No. 5,869,870.

BACKGROUND OF THE INVENTION

1. Field of the Invention

The present invention relates generally to electrostatic discharge (ESD) protection in integrated circuit (IC) packages, and more particularly, to ESD protective devices provided to selected no-connect pins on an IC package for protection of the IC package and internal circuits against ESD stress applied to the no-connect pin.

2. Background Art

Electrostatic discharge (ESD) is a movement of static electricity from a nonconductive surface, which could cause damage to semiconductors and other circuit components in ICs. A person walking on a carpet, for instance, can carry an amount of electrostatic charge up to several thousands of volts under high humidity conditions and over 10,000 volts under low humidity conditions. When touching ICs by hand, the instantaneous power level of the ESD could cause severe damage to the ICs. CMOS (complementary metal-oxide semiconductor) logic ICs are especially vulnerable to ESD.

To protect IC packages against ESD damage, various solutions have been proposed. One solution suggests the provision of an ESD protective device between the internal semiconductor devices in the IC chip (hereinafter referred to as "internal circuit") and the corresponding bonding pad. FIG. 1 shows the wire connection in an IC package which includes bonding pads 11, 13, 15 electrically connected to the internal circuit 20 of the IC package. A number of pins, or leads, for example, as those indicated by the reference numerals 10, 12, 14, 16, 17, 18, 19 are provided on the IC package, of which the pin 10 is a power pin (i.e., Vdd or Vss pin) which is connected to the bonding pad 11 via a bonding wire 100, pin 12 is an I/O pin internally connected to the bonding pad 13 via bonding wire 120, pin 14 is an input pin internally connected to the bonding pad 15 via bonding wire 140, and other pins 16, 17, 18, 19 are not in use and are thus referred to as no-connect pins. To prevent ESD current from flowing into the internal circuit via pins 10, 12, 14, conventional ESD protective circuits (not shown) are provided between the bonding pads 11, 13, 15 and the internal circuit so as to divert the ESD current from entering the internal circuit.

A trend in IC packaging is to provide a larger number of pins with a smaller pitch between the pins to achieve a high packing density of I/O on the IC package. Thus, the gap (i.e., the pitch) between two adjacent pins, for example, as indicated by the reference number G in FIG. 1 between the pins 14 and 19, is reduced. This, however, causes new problems in providing ESD protection for the IC package, as discussed in detail in a paper entitled "New Failure Mechanism due to No-Connect Pin ESD Stressing" by Matsumoto of Japan in 1994 EOS/ESD Symposium, pp.90–95. The paper reveals the fact that, when a human body model (HBM) ESD pulse is repeatedly applied to a no-connect pin on the IC package, any of the two neighboring pins, if wired to the internal circuit, would become vulnerable to ESD damage. This is because the electrostatic charge will accumulate in the resin around the no-connect pin, resulting in a large potential difference between the no-connect pin and its neighboring pins, which would significantly reduce the ESD resistance capability of the neighboring pins.

Taking the IC package of FIG. 1 as an example, it will be assumed that the input pin 14 is able to withstand a maximum ESD voltage of 3 kV when applied directly to the input pin 14. When an ESD voltage of 1.5 kV, for example, is received by the no-connect pin 19, the electrostatic charge will be accumulated in the resin around the no-connect pin 19, resulting in a large potential difference between the no-connect pin to its neighboring pins that would eventually cause an electrostatic discharge through the gap G to the neighboring wired pin 14, thus causing ESD damage to the internal circuit 20 via the bonding wire 140 and the bonding pad 15. Therefore, it is apparent that an ESD voltage having a significantly smaller magnitude than the maximum level withstandable by the wired pins, when received by a neighboring no-connect pins, could nonetheless cause ESD damage to the IC via the wired pins.

Accordingly, there remains a need for schemes of positioning ESD protective devices that are capable of protecting the wired pins against ESD due to ESD voltages received by neighboring no-connect pins.

SUMMARY OF THE INVENTION

It is an object of the present invention to provide one or more schemes of positioning ESD protective devices in an IC package, which are capable of protecting an internal circuit connected to wired pins on the IC package against ESD damage due to ESD stress at neighboring no-connect pins.

In accordance with the foregoing and other objectives of the invention, a new and improved ESD protective device for ESD protection of an IC package is provided. The ESD protective device includes an ESD protective unit coupled to the IC power bus and a bonding pad coupled between the ESD protective device and the no-connect pin. The ESD protective unit causes the ESD stress applied at the associated no-connect pin to be diverted to the power bus, thus preventing ESD damage to the internal circuit due to a potential difference at a no-connect pin adjacent to an active pin. The present invention selectively connects no-connect pins to ESD protective devices based on novel selection schemes, which flexibly adapt to different design and process technologies

BRIEF DESCRIPTION OF THE DRAWINGS

The invention can be more fully understood by reading the subsequent detailed description of the preferred embodiments, with reference made to the accompanying drawings.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

Figure 1:
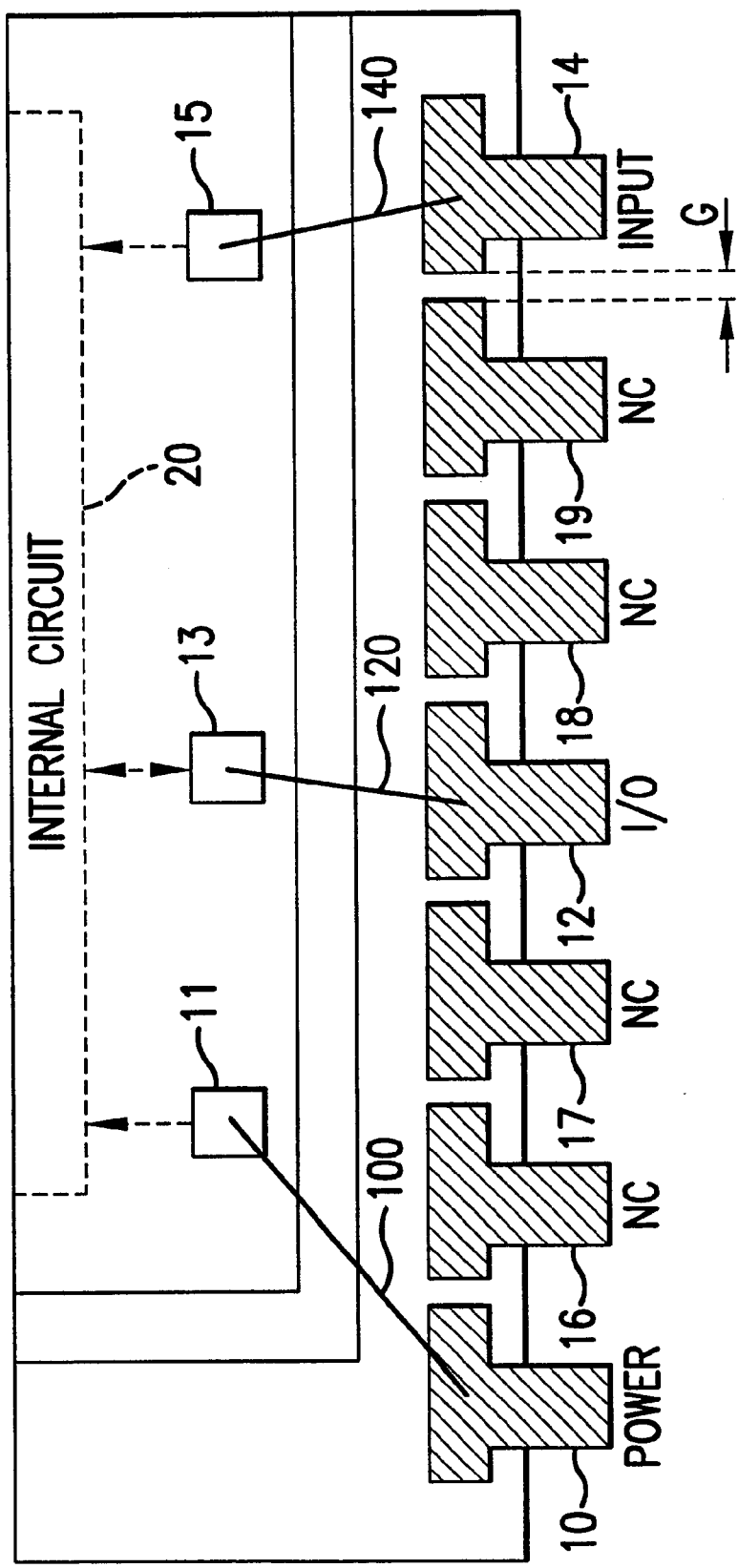
FIG. 1 is a schematic diagram of a conventional IC package, particularly used to depict the cause of ESD damage due to a potential difference between wired and no-connect pins.
Figure 2:
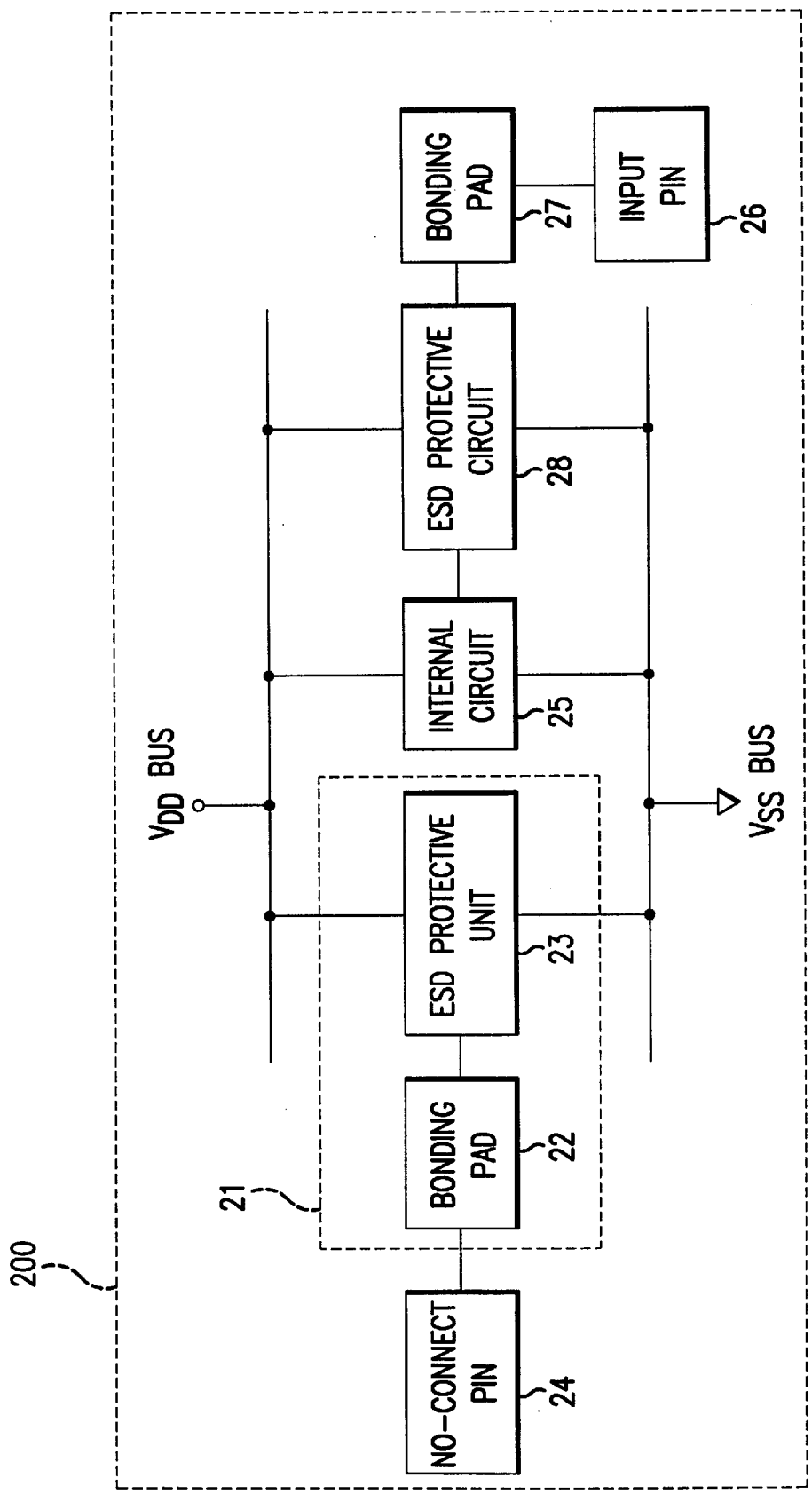
FIG. 2 is a schematic block diagram of an IC package incorporating the ESD protective device according to the present invention.

FIG. 2 shows a schematic block diagram of an IC package 200, including an internal circuit 25, at least one no-connect pin 24, and a wired pin 26 connected to a bonding pad 27. A conventional ESD protective circuit 28 is coupled between the internal circuit 25 and the bonding pad 27 corresponding to the wired pin 26, to provide ESD protection for the internal circuit 25.

When the no-connect pin 24 receives an ESD stress, the ESD current will flow to the bonding pad 22, and will be subsequently diverted by the ESD protective unit 23 to the power bus. In this way, the ESD stress would not cause a reduction in its ESD protective capability with respect to its neighboring wired pins.

Figure 3:
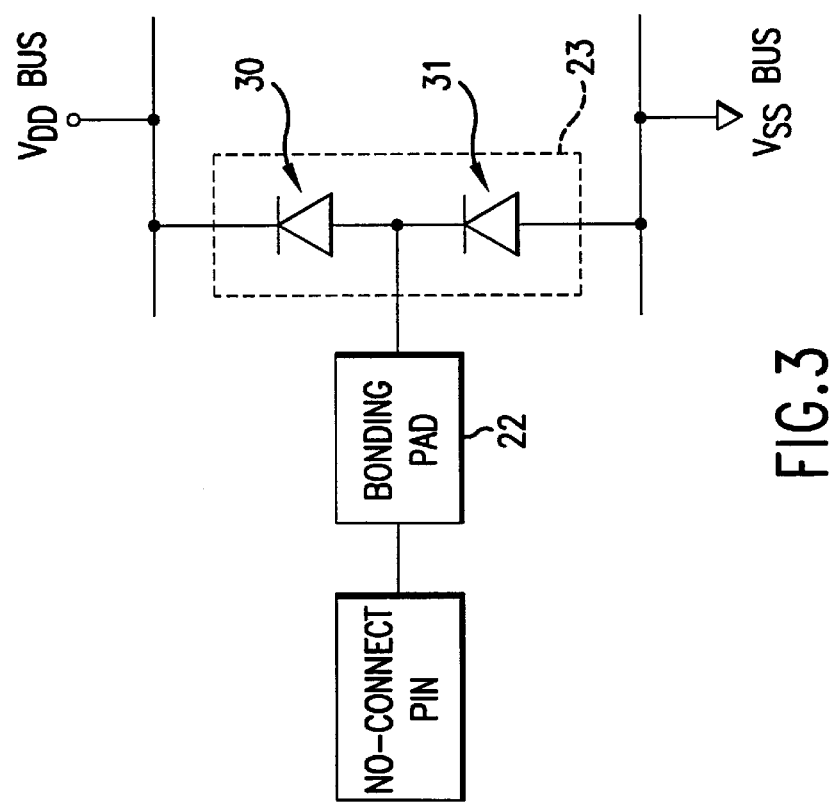
FIG. 3 is a circuit diagram of a first preferred embodiment of the ESD protective device according to the present invention.

Referring to FIG. 3, there is shown a first preferred embodiment of the ESD protective unit 23, which includes a pull-up diode 30 and a pull-down diode 31. The semiconductor structure of the pull-up diode 30 includes a p+ type diffusion region and an n-well, while the semiconductor structure of the pull-down diode 31 includes an n+ type diffusion region and a p-well. The pull-up diode 30 has a cathode coupled to the Vdd power bus and an anode coupled to the cathode of the pull-down diode 31, while the pull-down diode 31 has an anode coupled to the Vss power bus. The bonding pad 22 corresponding to the no-connect pin is coupled to the anode of the pull-up diode 30. The p+ type diffusion region in the pull-up diode 30 and the n+ type diffusion region in the pull-down diode 31 each has an area of 40 um×10 um, for example.

Figure 4:
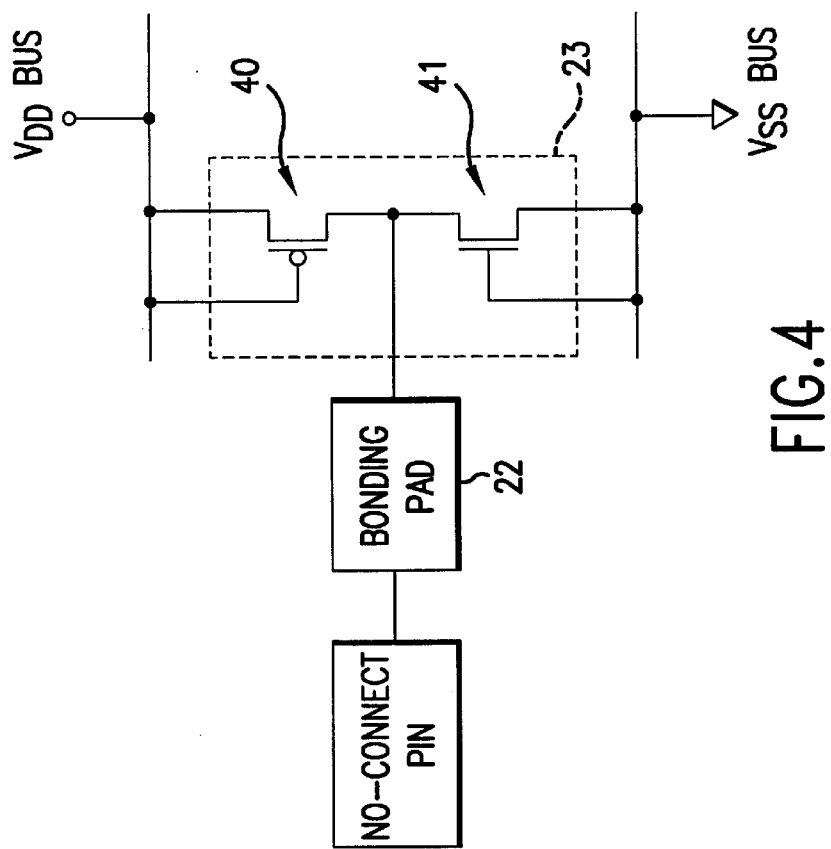
FIG. 4 is a circuit diagram of a second preferred embodiment of the ESD protective device according to the present invention.

Referring to FIG. 4, there is shown a second preferred embodiment of the ESD protective unit 23, which includes a pull-up p-type CMOS transistor 40 and a pull-down n-type CMOS transistor 41. The pull-up p-type CMOS transistor 40 has a gate and a source coupled to the Vdd power bus and a drain coupled both to the bonding pad 22 corresponding to the no-connect pin and to the drain of the pull-down n-type CMOS transistor 41. The pull-down n-type CMOS transistor 41 has a gate and a source coupled to the Vss power bus. The pull-up p-type CMOS transistor 40 has a channel length of 0.65 um, for example, and a total channel width of 250 um, for example; while the pull-down n-type CMOS transistor 41 has a channel length of 0.6 um, for example, and a total channel width of 250 um, for example.

Figure 5:
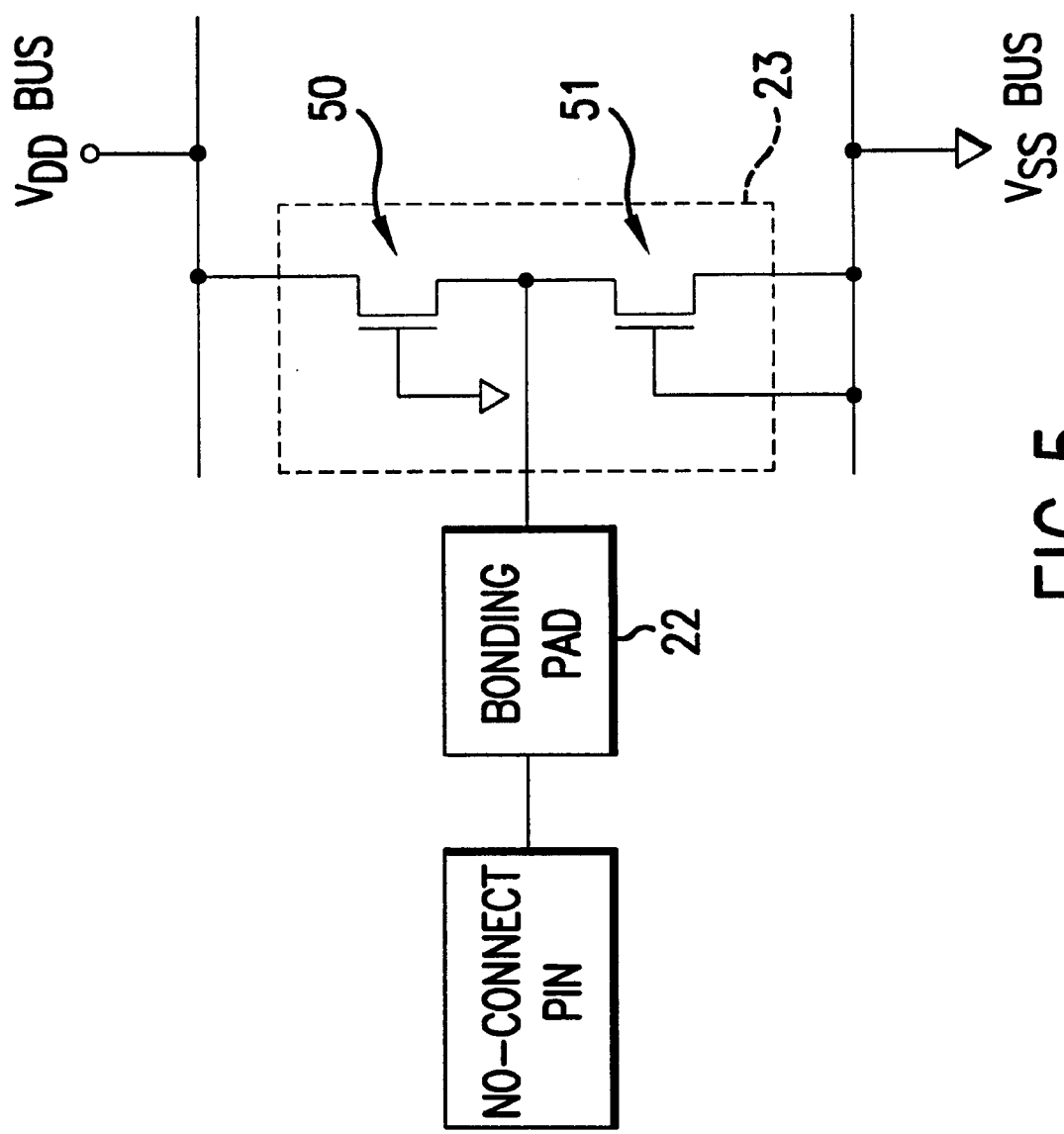
FIG. 5 is a circuit diagram of a third preferred embodiment of the ESD protective device according to the present invention.

Referring to FIG. 5, there is shown a third preferred embodiment of the ESD protective unit 23, which includes a pull-up n-type MOS transistor 50 and a pull-down n-type MOS transistor 51. The pull-up n-type MOS transistor 50 has a drain coupled the Vdd power bus, a source coupled both to the bonding pad 22 corresponding to the no-connect pin and to the drain of the pull-down n-type MOS transistor 51, and a gate coupled to the ground. Further, the pull-down n-type MOS transistor 51 has a source and a gate coupled to the Vss power bus. The pull-up n-type MOS transistor 50 and the pull-down n-type MOS transistor 51 each has a channel length of 0.5 um, for example, and a total channel width of 200 um, for example.

Besides the circuit elements utilized by the foregoing embodiments, the ESD protective unit 23 can be implemented through the use of zener diodes, n-well resistors, polysilicon resistors, diffusion resistors, thin oxide field effect transistors (FETs), thick oxide FETs, low voltage trigger silicon controlled rectifiers (LVTSCRs), or a combination of these devices. The circuit elements chosen must cause an ESD current present at the input to the ESD protective unit 23 to divert the current to the Vdd and Vss power bus.

In IC packages, those pins that are used for signal input and/or output and power transmission are referred to as "active pins". According to the present invention, each active pin is connected to one ESD protective circuit 28. Comparing the ESD resistance capability of all the active pins, the power pins (Vdd and Vss pins), which are connected respectively to the Vdd power bus and the Vss power bus, typically possess the strongest ESD resistance capability. This is because the Vdd power bus and the Vss power bus are usually provided with an ESD protective circuit 28 therebetween, and a capacitance of about 1 nF (nanofarad) to 10 nF exists between the n-well and p-well of this ESD protective circuit 28, which can absorb quite a large amount of ESD energy. Further, input/output (I/O) pins and the output pins possess the next strongest ESD resistance capability, whereas the input pins possess the weakest ESD resistance capability. This is because the I/O pins and the output pins are usually connected to output buffers that are part of the ESD protective circuits 28. Thus, the I/O pins and the output pins usually provide greater ESD protection than the input pins.

As a consequence, if a no-connect (NC) pin is arranged next to an input pin, that NC pin should be connected by a bonding wire to a bonding pad, which will be connected to the ESD protective unit 23 according to one embodiment of the present invention. The ESD protective unit 23 together with the bonding pad 22 form an ESD protective device 21. However, if the NC pin is arranged next to a Vdd pin, a Vss pin, an I/O pin, or an output pin, the NC pin does not need to be coupled to an ESD protective unit 23.

Furthermore, according to one embodiment of the present invention, if an input pin is arranged next to a number of successively arranged NC pins, each of the NC pins should be connected by a bonding wire to a bonding pad, which should be connected to an ESD protective unit 23. However, if the active pin adjacent to those NC pins is other than an input pin, the NC pins adjacent to this active pin do not need to be coupled to an ESD protective unit 23.

Figure 6:
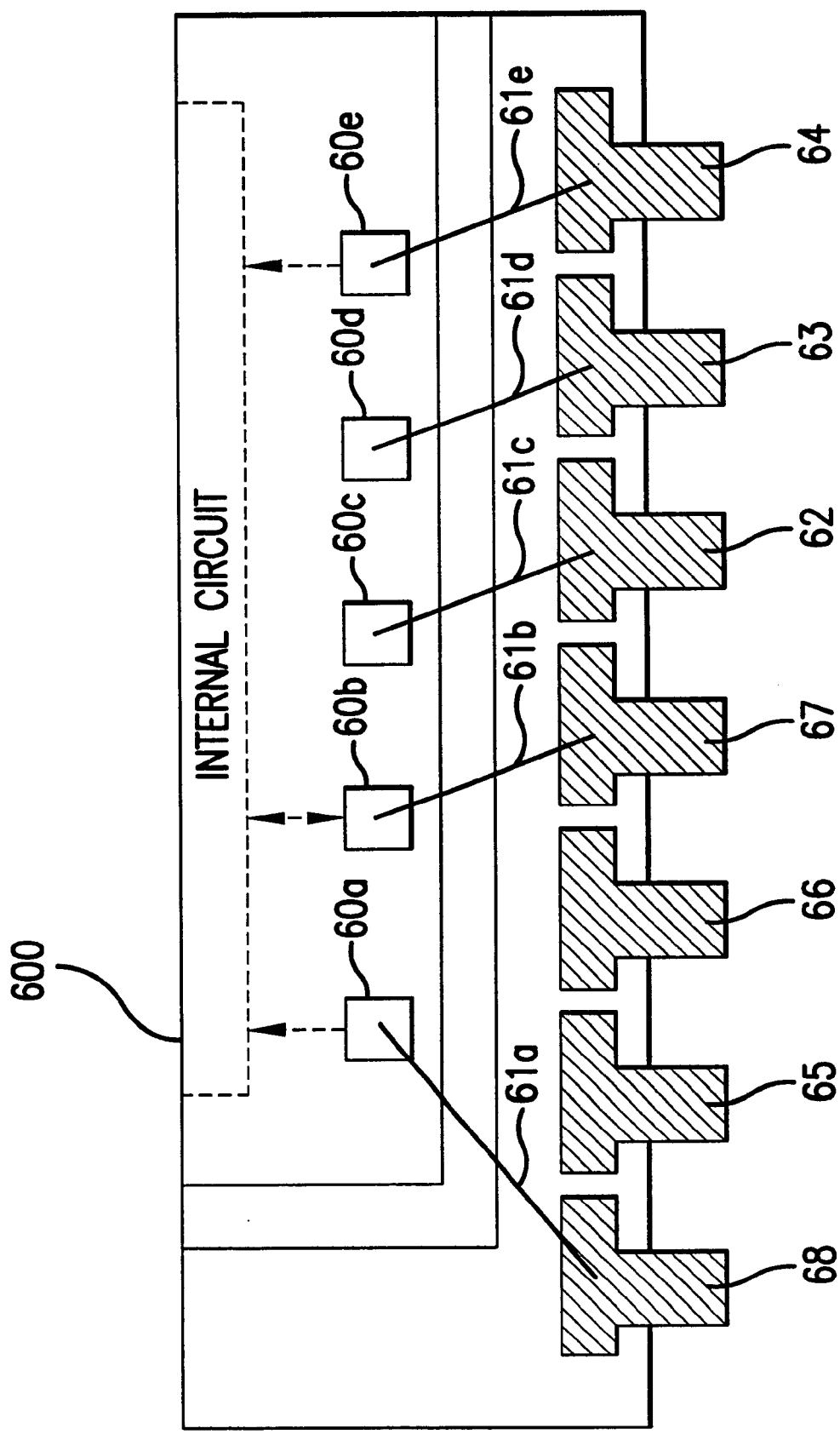
FIG. 6 is a schematic diagram of an IC package incorporating the ESD protective device according to the present invention, particularly used to depict the selective connection of no-connect pins to the ESD protective device according to the present invention.

Referring to FIG. 6, there is shown an IC package 600 according to one embodiment of the present invention which utilizes the ESD protective device and principles set forth above. The IC package 600 is provided with a plurality of bonding pads 60a, 60b, 60c, 60d, 60e, and a plurality of pins including, for example, a pair of NC pins 62, 63, an input pin 64, another pair of NC pins 65, 66, an I/O pin 67, and a Vdd pin 68. Since the NC pins 62, 63 are successively arranged and the input pin 64 is immediately next to them, the NC pins 62, 63 should each be connected by a bonding wire 61c, 61d, respectively, to a bonding pad 60c, 60d, respectively, which in turn is connected to a separate ESD protective unit. As to the other pair of NC pins 65, 66 which are also successively arranged, since the pin immediately next to them on the right is the I/O pin 67 and the pin immediately next to them on the left is the Vdd pin 68, connection of these NC pins 65, 66 to the bonding pads 60 is not necessary.

The selective connection of no-connect pins to ESD protective devices according to the present invention prevents ESD damage from occurring at the input pins due to ESD stress at the NC pins. Although all of the NC pins can each be connected to one ESD protective device, this will cause the chip size, as well as manufacturing cost, to increase. Alternatively, one or more successively arranged NC pins next to an input pin can each be connected to one ESD protective device, or one or more successively arranged NC pins next to an output pin or an I/O pin can each be connected to one ESD protective device. In short, the connections can be devised according to practical requirements.

The principles of the present invention can be extended as illustrated in FIGS. 7–15 and described hereinbelow. FIGS. 7–15 illustrate additional embodiments of the present invention that utilize general principles discussed previously with reference to FIGS. 2–6.

The present invention can selectively couple NC pins to ESD protective devices based on the strength rating (also known as tolerance) of the ESD protective device to which an adjacent wired pin is coupled. ESD strength rating is based on ESD testing results and ESD protection level requirements that are determined according to the specifications of a particular IC. The strength ratings are obtained by packaging an IC die and testing all wired pins of the IC. These strength ratings can be, for example, 2 kV, 4 kV, 10 kV, etc., with each such kV value representing the tolerance of the ESD protective device.

In addition, pins (NC and active pins) can be considered to be "strong" or "weak". The "strength" or "weakness" of a pin depends on a combination of (1) the type of pin (e.g., power pins can be designated as "strong pins" while input pins can be designated as "weak" pins), and (2) the type (i.e., strength rating) of the ESD protective device that is coupled to the pin. For example, an input pin with a strong ESD protective device can become a "strong" pin, while an I/O pin with a weak ESD protective device can become a "weak" pin. A "strong" pin can be defined as any pin that will survive a test of (a) a direct stress, or (b) an adjacent NC pin stress, that is at or higher than the specification's ESD strength rating for the ESD protective device. As an example, if 2 kV is the ESD strength rating that is set by the IC's specifications, a strong pin can include: (a) a pin that survives a much higher ESD stress (e.g., 3.5 kV) that is directly applied to the pin, and (b) a pin that survives an ESD stress of greater than or equal to 2 kV on an adjacent NC pin. In the first scenario (a), the "large margin" between 3.5 kV and 2 kV can provide the assumption that the pin will survive an ESD stress of greater than or equal to 2 kV on an adjacent NC pin. This "large margin" can be selected to be at least 1 kV. Thus, as described above, an input pin can even be considered "strong" if it is coupled to an ESD protective device having a high strength rating.

The ESD strength can be rated differently based on a number of different factors, including but not limited to: (1) ESD circuit design, (2) the manufacturing process used, and (3) the strength of the ESD protection provided for the adjacent pin. By selectively coupling NC pins to ESD protective devices, the present invention optimizes the wire bonding for NC pins for different circuit manufacturing process technologies, thereby leading to improved overall ESD protection for NC pins against ESD stress.

Furthermore, when there is an array of successive arranged NC pins, the present invention sets forth schemes for determining which of the NC pins in that array are to be coupled to ESD protective devices based on certain predetermined criteria. For example, as will be described in greater detail hereinafter, when the ends of the array are adjacent to strong wired pins, or wired pins with a high strength rating, the NC pins between these strong pins do not have to be coupled to an ESD protective device and can still be protected from ESD.

Unlike the prior art that blindly couples every no-connect pin to an ESD protection device, the present invention selectively connects NC pins to ESD protective devices based on novel selection schemes, which flexibly adapt to different design and process technologies, thereby reducing chip size and manufacturing costs while providing adequate ESD protection against stress on NC pins.

FIGS. 7–10 illustrate the principle that NC pin(s) that are surrounded by adjacent strong pins do not need to be bonded to any ESD protective device, even if the surrounding strong pins include NC pins, as long as these surrounding NC pins are strong pins, or have been bonded to an ESD protective device that has a strong strength rating. On the other hand, the NC pin(s) should be bonded to at least one ESD protective device if they are adjacent one or more weak pins. For example, an NC pin adjacent the weak pin can be bonded to an ESD protective device having a high strength rating.

Figure 7:
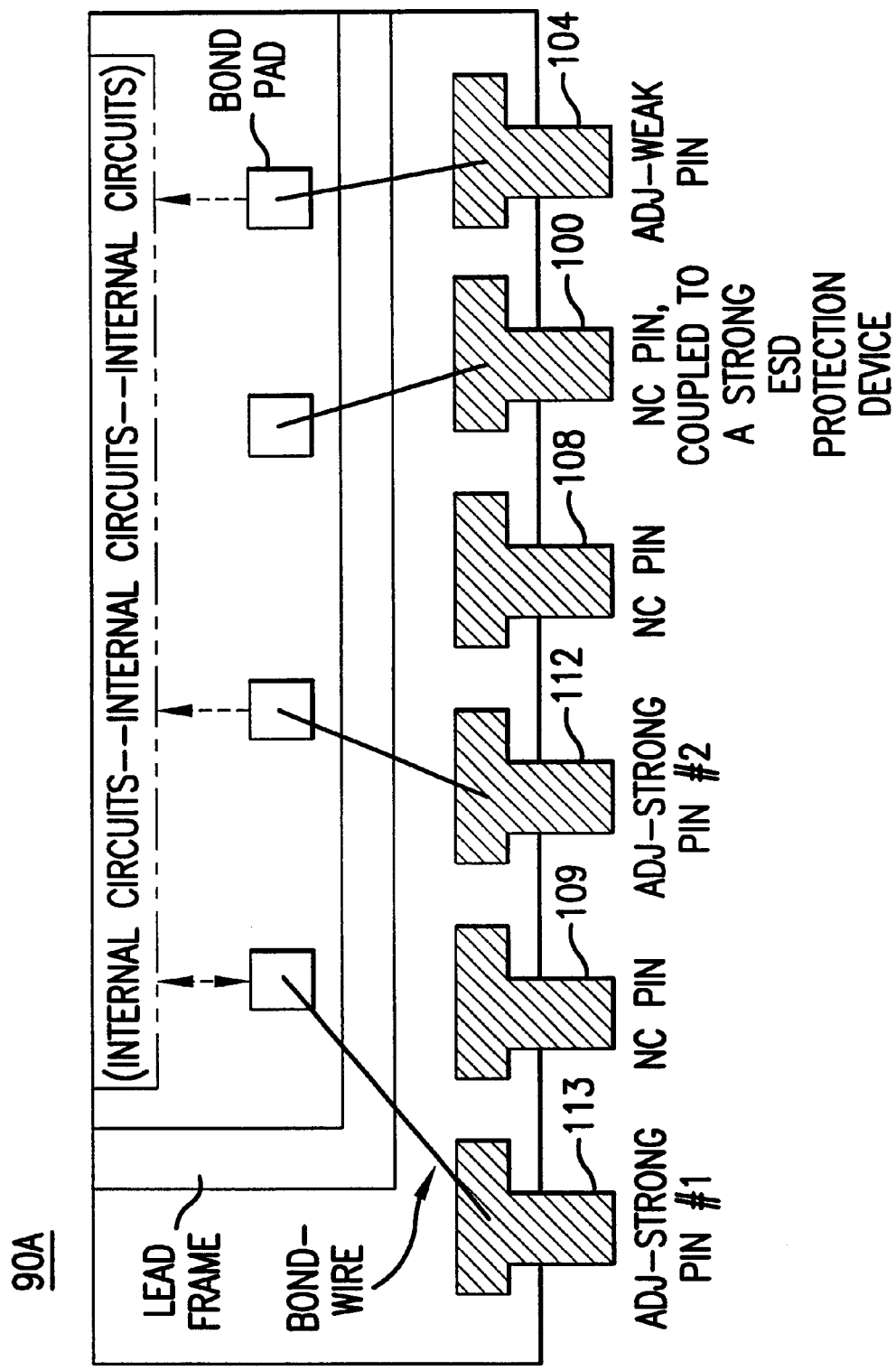
FIGS. 7–15 are schematic diagrams of IC packages where the no-connect pins are selectively connected according to different embodiments of the present invention.

FIG. 7 illustrates an IC package 90A having a first NC pin 100 that is coupled to an ESD protective device. It is noted that the NC pins can be directly coupled to ESD protective devices, or coupled to the ESD protective devices through an intermediate connection point, such as a bond pad. As used herein, the terms "wire coupled" or "coupled" can refer to either a direct connection between the NC pin and the ESD protective device or an indirect connection (i.e., via a bonding pad) therebetween. Active pins (i.e., I/O pins, power pins, input pins, output pins) are normally wire-bonded to a bond pad, which is then coupled to ESD protective devices and the internal circuits. In addition, the term "adjacent" as used herein is intended to mean "directly next to".

First NC pin 100 is disposed adjacent to a pin 104 having (i.e., coupled to) a first type of ESD protective device which has a sufficiently low ESD strength rating so as to render pin 104 a "weak" pin. A non-limiting example of a weak pin 104 can be an input pin in a CMOS process or an input/output (I/O) pin in a salicided MOSFET process. The weak pin 104 is coupled to an ESD protective device. Because NC pin 100 is adjacent a "weak" pin 104, it is preferably coupled to an ESD protective device. In this embodiment, NC pin 100 can be coupled to a second type of ESD protective device which has a sufficiently high ESD strength rating so as to render NC pin 100 a "strong" pin.

IC package 90A further includes a second NC pin 108 and a third NC pin 109, between which is positioned a pin 112 coupled to or having the second type of ESD protective device. Since second NC pin 108 is surrounded by two "strong" pins 100 and 112, it does not need to be coupled to an ESD protective device. Positioned adjacent third NC pin 109 on the other side of pin 112 is a pin 113 coupled to or having the second type of ESD protective device. Again, since third NC pin 109 is disposed adjacent to two "strong" pins 112, 113, it does not need to be coupled to an ESD protective device.

If NC pin 100 is instead coupled to one of the first type of ESD protective device, then pin 100 itself becomes a "weak" pin, so that NC pin 108 may need to be coupled to an ESD protection device. It is noted that the pin 112 can be disposed either to the right or left of second NC pin 108 without changing the wire bonds shown in FIG. 7. Non-limiting examples of strong pins 112, 113 can include a Vdd pin, an I/O pin, or even an input pin if the pin 112 or 113 is coupled to one of the second type of ESD protective device.

The ESD strength rating for the pins in FIG. 7 is different from the strength ratings used in FIG. 6. For example, in FIG. 6, the strength rating can be in the following order (from strongest to weakest): (1) a power pin, such as Vdd or Vss; (2) an I/O pin; and (3) an output pin, and (4) an input pin. In contrast, for the IC of FIG. 7 used in a CMOS process, the strength rating can be in the following order (from strongest to weakest): (1) a power pin, such as Vdd or Vss; (2) an I/O pin; and (3) an NC pin coupled to a bond pad and an ESD protective device. As a further example, for the IC of FIG. 7 used in a salicided MOSFET process, the strength rating can be in the following order (from strongest to weakest): (1) a power pin, such as Vdd or Vss; (2) an input pin; (3) an NC pin coupled to a bond pad and an ESD protective device.

Figure 8:
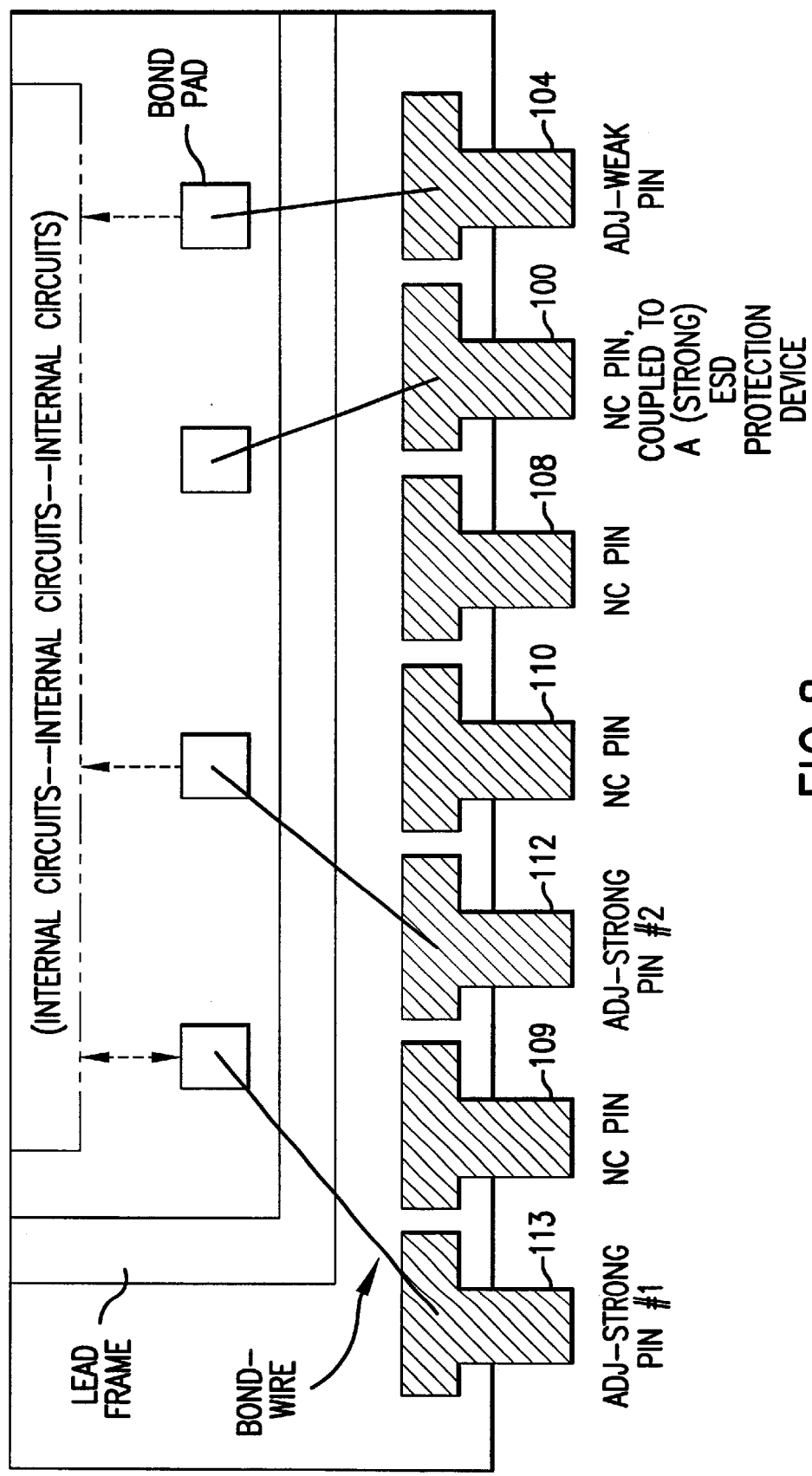

FIG. 8 illustrates an IC package 90B that is essentially the same as IC package 90A (and hence the same numeral designations are used for like elements), except that an additional NC pin 110 is provided between NC pin 108 and "strong" pin 112. In this embodiment, the "strong" pins (e.g., 100, 112, and 113) can include, but are not limited to, the following types of pins: (1) a power pin, such as vdd or Vss; (2) an input/output (I/O) pin; (3) an NC pin that is coupled to a bond pad and one of the second type of ESD protective device; or (4) an NC pin that is adjacent to another NC pin which is coupled to one of the second type of ESD protective device. Since NC pins 110 and 108 are surrounded by strong pins 100 and 112, both are floating and are not coupled to any ESD protective device. Thus, FIG. 8 illustrates the principle that an array of NC pins (i.e., 108 and 110) does not need to be bonded to any ESD protective device if the surrounding pins are "strong" pins, even if the surrounding "strong" pins include NC pins (e.g., 100) that have been bonded to an ESD protective device that has a high strength rating (i.e., of the second type).

Figure 9:
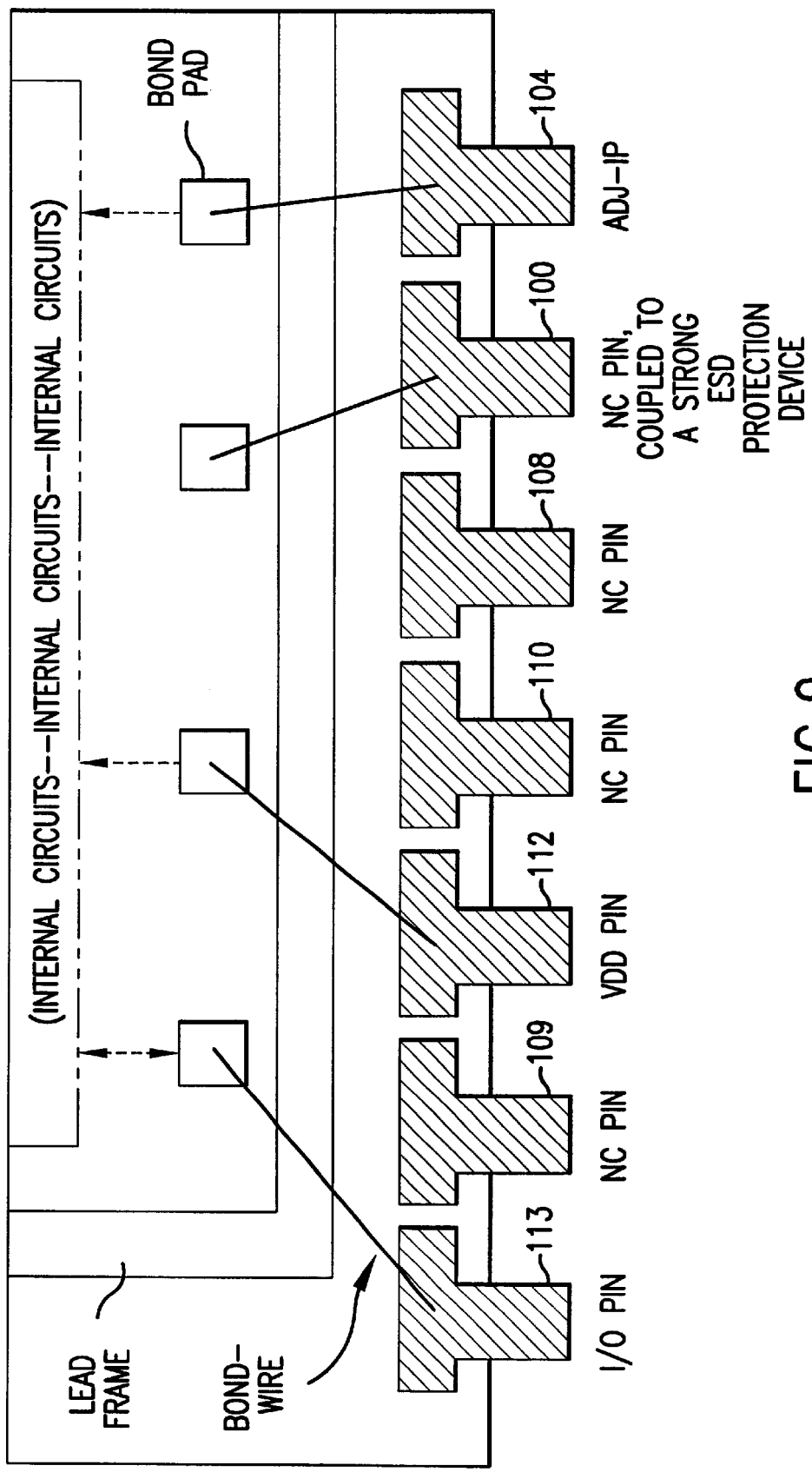

FIG. 9 illustrates a specific example of FIG. 8 where the strong pin 113 is an I/O pin, the strong pin 112 is a power pin, such as a Vdd pin, and the weak pin 104 is an input pin.

Figure 10:
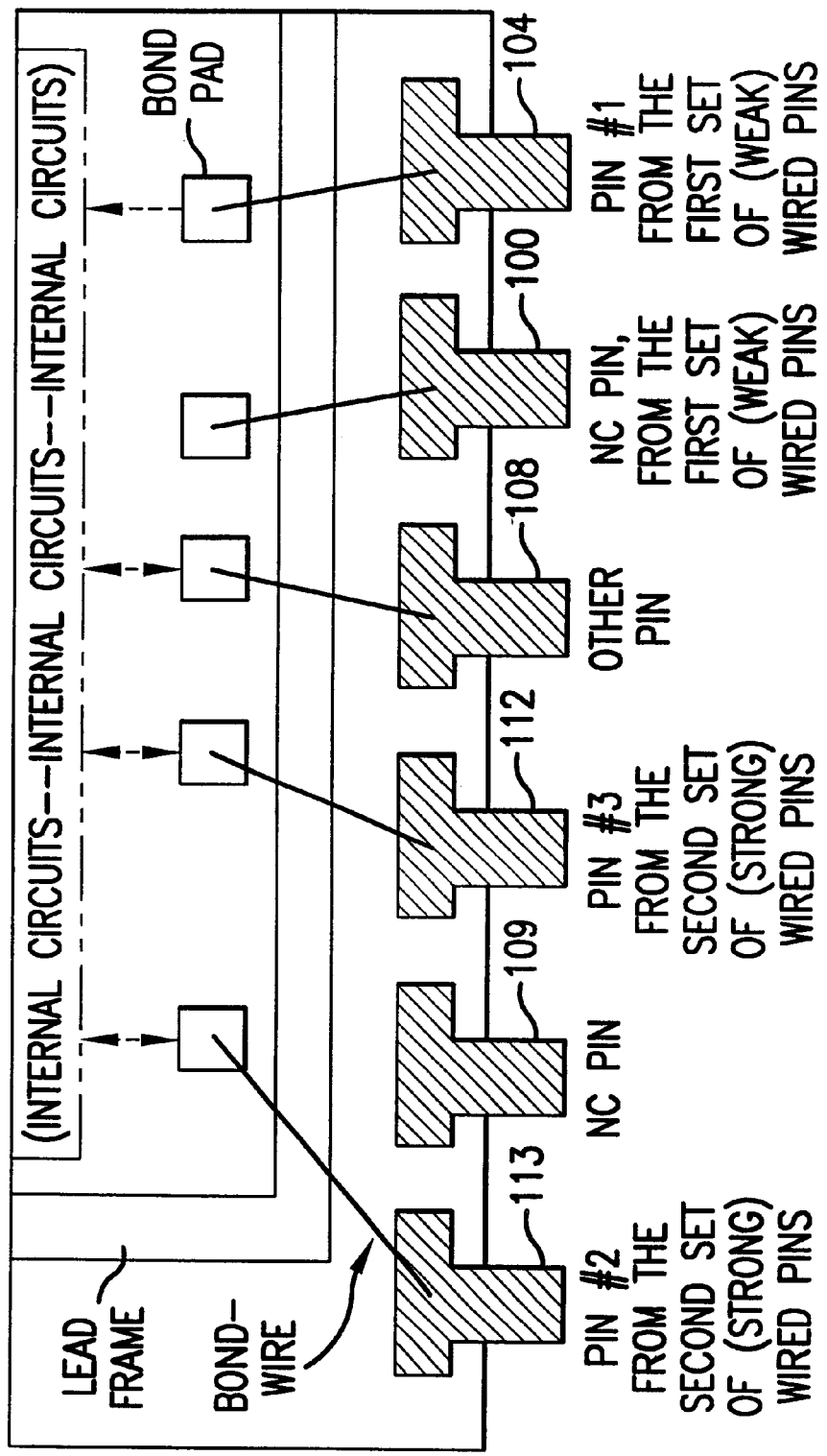

FIG. 10 illustrates an IC package 90D that is essentially the same as IC package 90A (and hence the same numeral designations are used for like elements), except that pin 108 can be any pin (including an NC pin), and the NC pin 100 adjacent to it is coupled to one of the first type of ESD protective device (i.e., it is a weak pin). Since the NC pin 100 is a weak pin, pin 108 is bonded to an ESD protective device. Thus, FIG. 10 illustrates the principle that any pin should be bonded to an ESD protective device if it is adjacent one or more weak pins.

Figure 11:
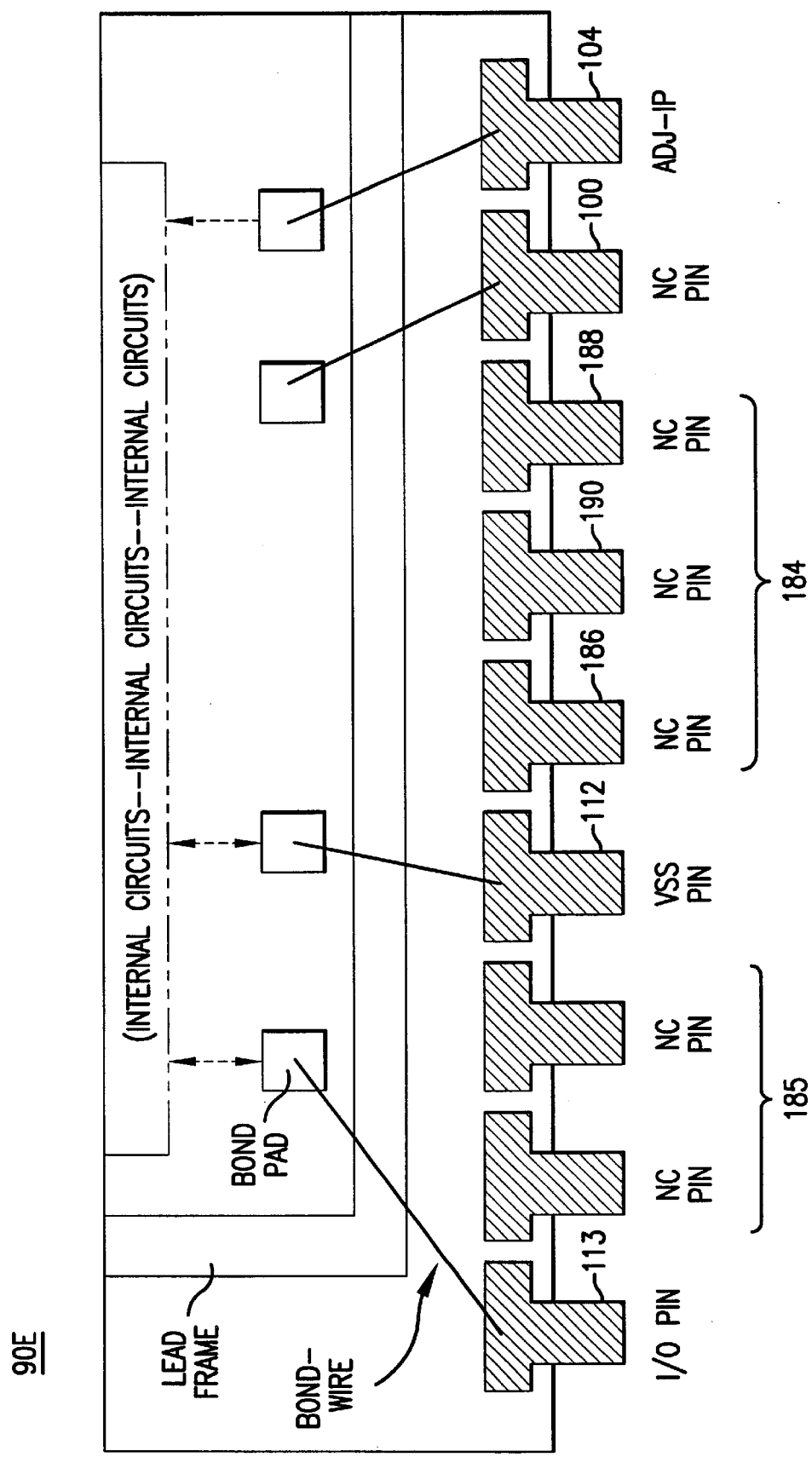
Figure 12:
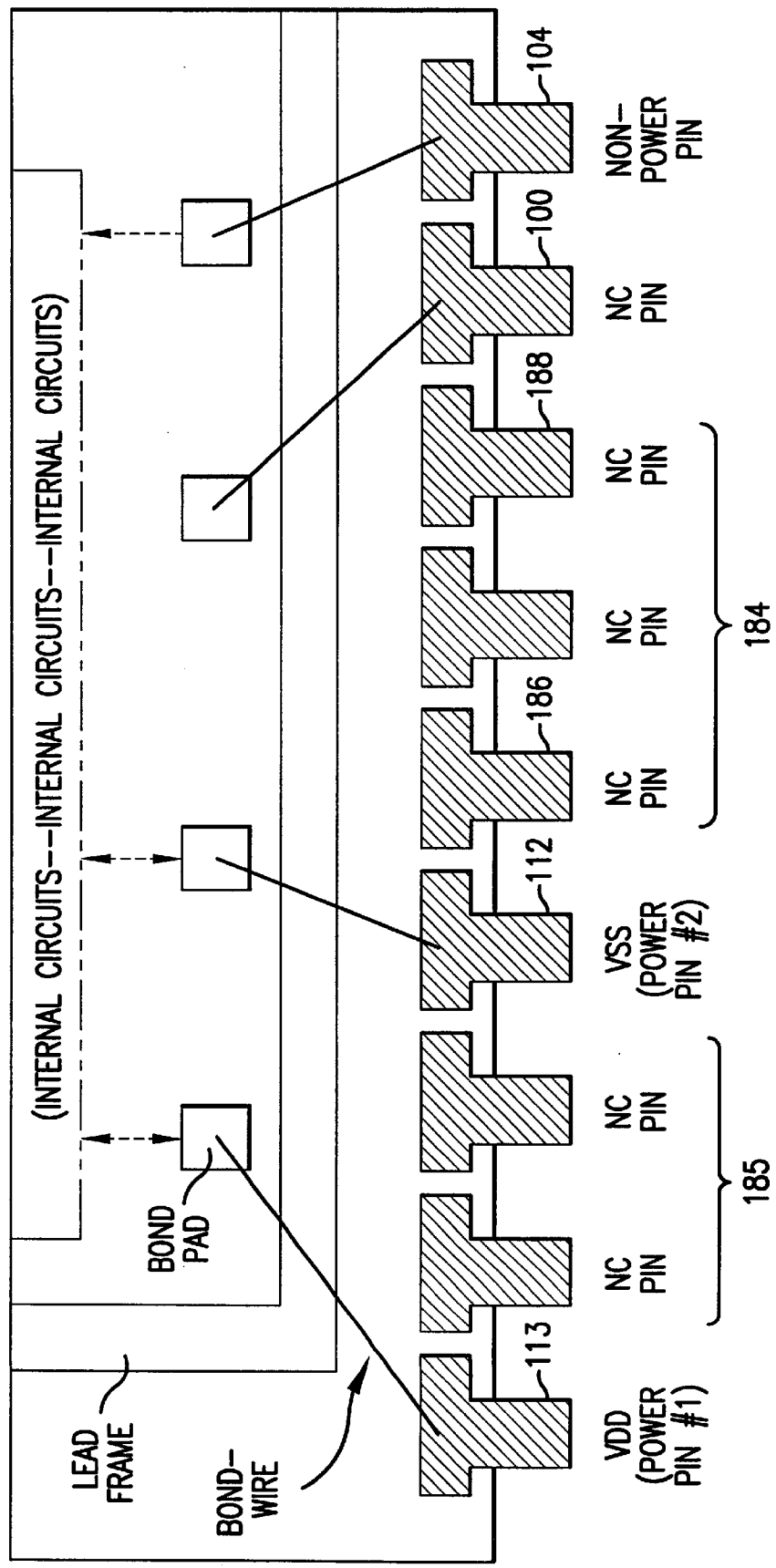
Figure 13:
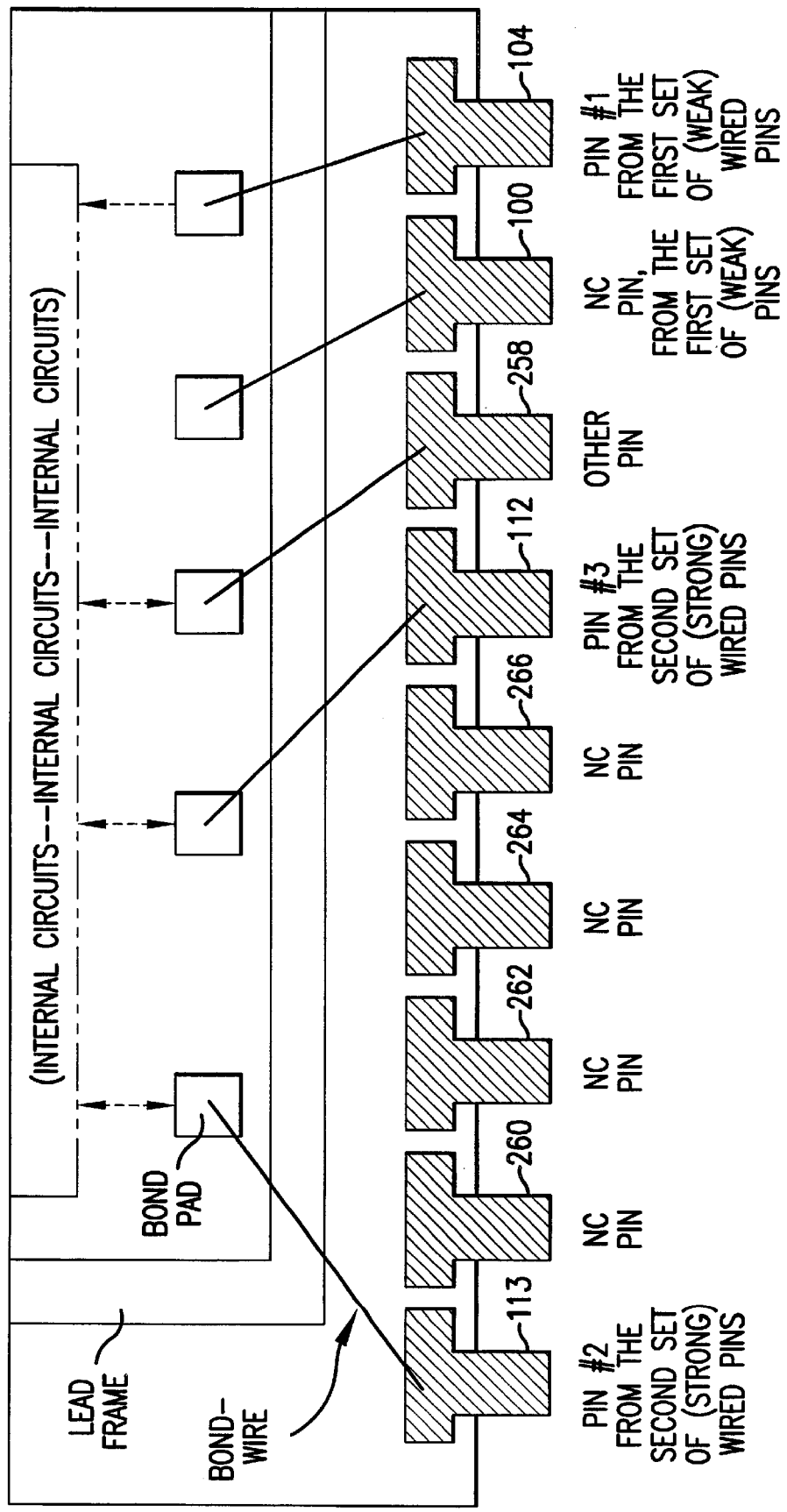

FIGS. 11–13 illustrate IC packages 90E–90F with different variations for the positioning of one or more arrays of NC pins, with these packages 90E–90F applying the principles illustrated above in connection with FIGS. 7–10.

FIG. 11 illustrates an IC package 90E that is essentially the same as IC package 90A (and hence the same numeral designations are used for like elements), except that the NC pin 109 in FIG. 7 has been replaced by an array 185 of two or more successively-arranged NC pins in FIG. 11, and NC pin 108 in FIG. 7 has been replaced by an array 184 of two or more (in this case, three) successively-arranged NC pins 184 in FIG. 11. Pin 104 is a weak pin (e.g., input pin). Array 184 includes a first end pin 186 that is disposed adjacent to the second strong pin 112 (e.g., a power Vss pin) and a second end pin 188 that is also disposed adjacent a strong pin 100 (e.g., an NC pin 100 coupled to an ESD protective device of the second type), so that its middle pins (in this case, only one pin 190) do not need to be coupled to an ESD protective device. Similarly, array 185 has two NC pins that are interposed between two strong pins 113 (e.g., an I/O pin) and 112 (e.g., a power Vss pin). Therefore, all the NC pins of arrays 184, 185 are not coupled to any ESD protective device.

FIG. 12 illustrates an IC package 90F that is essentially the same as IC package 90E (and hence the same numeral designations are used for like elements), except that pin 113 is a power pin, and pin 104 is any non-power pin. In this embodiment, a circuit designer could have designated only the power pins to be strong pins, with all the other pins to be designated as weak pins (e.g., with none coupled to an ESD protective device of the second type). Therefore, pin 104 is any non-power pin (i.e., a weak pin). In FIG. 12, pin 100 can be coupled to an ESD protective device of the second type so as to make pin 100 a strong pin, and so that the array 184 of pins do not need to be coupled to any ESD protective device.

FIG. 13 illustrates an IC package 90G that is essentially the same as IC package 90E (and hence the same numeral designations are used for like elements), but which incorporates the principles of FIG. 10. In FIG. 13, since pin 104 and NC pin 100 (which is coupled to an ESD protective device of the first type) are both weak, pin 258 (which can be any active or NC pin) is coupled to an ESD protective device even though it is adjacent a strong pin 112 on the other side. In addition, none of the pins in the array of NC pins 260, 262, 264, 266 are coupled to any ESD protective device because end pins 260 and 266 are disposed adjacent to strong pins 113 and 112, respectively.

Table I illustrates the possible combinations for pins 112, 113 in FIGS. 10 and 13 selected from the second set of wired pins 112, 113 that are adjacent to the NC pins, according to one non-limiting embodiment of the present invention.

Figure 14:
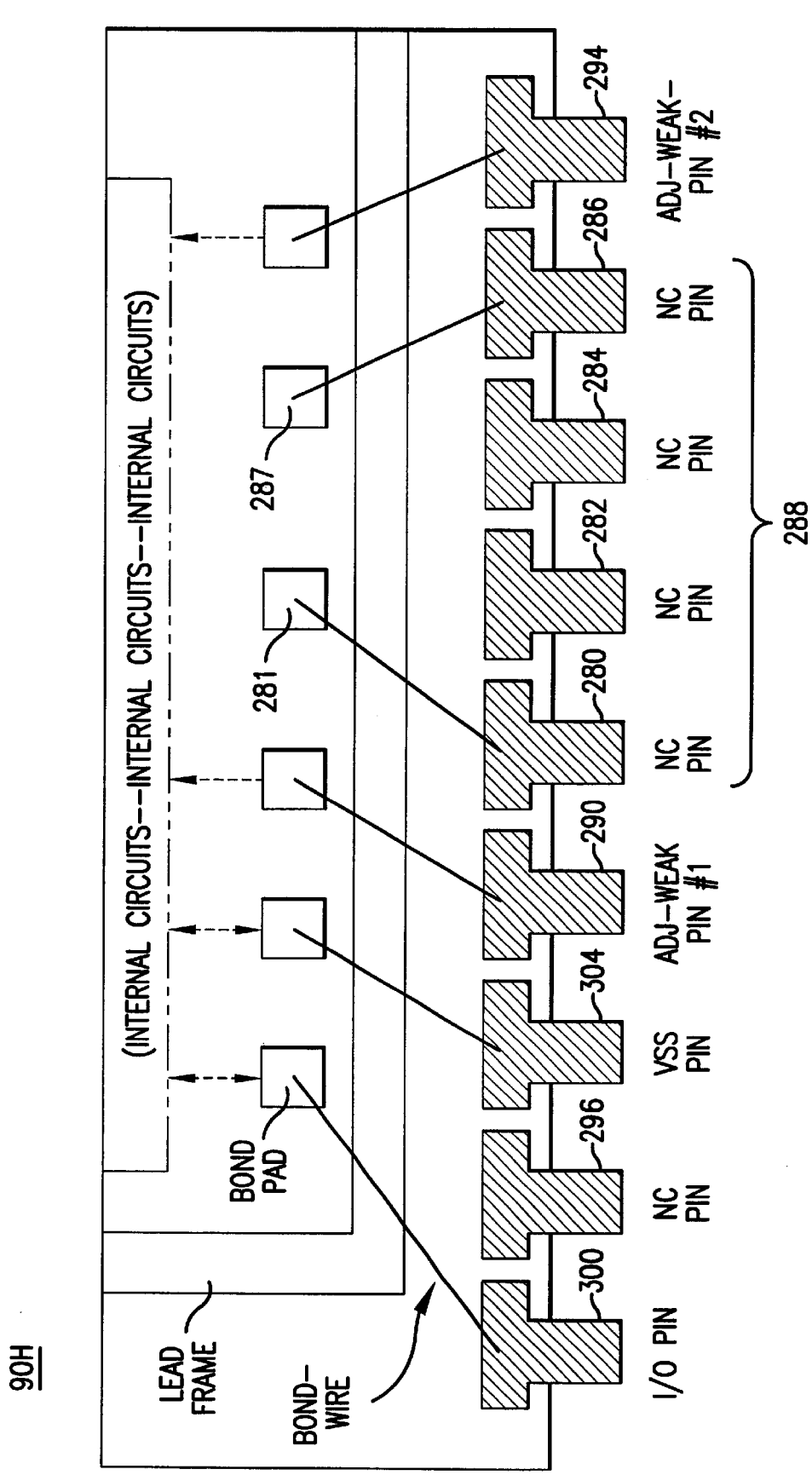
Figure 15:
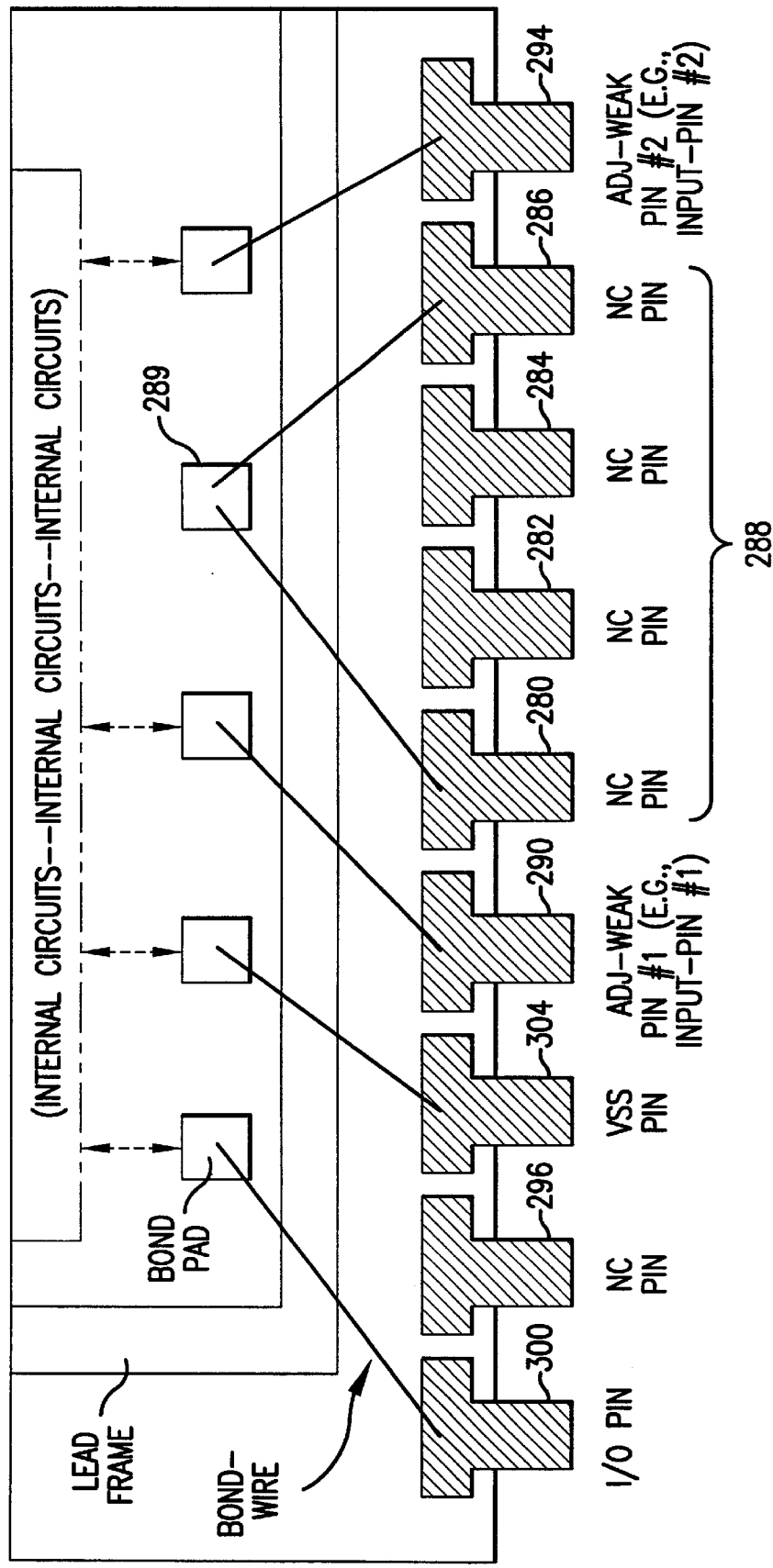

FIGS. 14 and 15 illustrate IC packages 90H and 90I having an array of NC pins that are surrounded on both sides by weak pins, and non-limiting ways for protecting this array of NC pins.

FIG. 14 illustrates an IC package 90H having a plurality of NC pins 280, 282, 284, 286 that are successively arranged to form an array 288. Array 288 has a first end NC pin 280 that, in this example, is adjacent a first weak pin 290 (e.g., an input pin) and a second end NC pin 286 that is disposed adjacent a second weak pin 294 (e.g., an input pin). In this embodiment, the selective connection scheme of the present invention specifies that the first end NC pin 280 and second end NC pin 286 be coupled to ESD protective devices, and in this example, can be coupled to ESD protective devices of the second type (i.e., with high strength rating) through bond pads 281 and 287, respectively, to make them strong pins. The other NC pins 282, 284 in this array 288 do not need to be coupled to ESD protective devices since the end NC pins 280, 286 are each coupled to an ESD protective device of the second type. However, if one or both of the end NC pins 280, 286 are coupled to an ESD protective device of the first type (i.e., with a low strength rating), then the middle NC pins 282, 284 may need to be coupled to ESD protective devices as well.

The IC package 90H further includes another NC pin 296 that is not coupled to an ESD protective device because it is surrounded by strong pins (e.g., I/O pin 300 and power Vss pin 304) that are themselves coupled to ESD protective devices having high strength ratings.

FIG. 15 illustrates an IC package 90I that is essentially the same as IC package 90H (and hence the same numeral designations are used for like elements), except that the first end NC pin 280 and the second end NC pin 286 are coupled to an ESD protective device through the same bond pad 289, thereby saving the number of bond pads and ESD circuits utilized.

The present invention thus provides a method of ESD protection. For an IC package having wired (i.e., active) pins and NC pins, the following steps can be performed. In a first step, the wired pins of an IC package are characterized as "weak" pins or "strong" pins. As noted earlier, the terms "weak" and "strong" can vary and depend on the type of pin, the ESD strength ratings (i.e., tolerance requirements), the type of ESD protective devices employed in a process technology, and ESD test results. In the next (second) step, any NC pin can be selectively wire-bonded to an ESD protective device if it is disposed adjacent a weak wired pin. In the third step, each such NC pin that has been wire-bonded to an ESD protective device will be characterized as "strong" or "weak" depending on the type of ESD protective device that it is coupled to. The second and third steps can be repeated for all NC pins, until there are no longer any remaining NC pins that are adjacent to a weak pin (i.e., all unbonded NC pins, or arrays of NC pins, are surrounded by strong pins).

The operation of this method can be illustrated in connection with FIGS. 7 and 10. Referring to FIG. 7, pins 104, 112 and 113 would already be wired, with pins 112 and 113 characterized as strong pins and pin 104 characterized as a weak pin. According to the method of the present invention, the NC pin 100 is adjacent a weak pin 104, so it is coupled to an ESD protective device. If NC pin 100 is coupled to an ESD protective device of the second type (i.e., NC pin 100 becomes a strong pin), then the method will determine that the other remaining NC pins 108 and 109 are completely surrounded by strong pins, so the method terminates. On the other hand, if NC pin 100 is coupled to an ESD protective device of the first type (i.e., NC pin 100 becomes a weak pin), then NC pin 108 would be adjacent a weak pin 100, so it is coupled to an ESD protective device (see FIG. 10). The method then repeats for the remaining NC pin 109 (or continuous array of pins). Specifically, if NC pin 108 is coupled to an ESD protective device of the first type (i.e., NC pin 108 becomes a weak pin), then NC pin 109 will be coupled to an ESD protective device, but if NC pin 108 is coupled to an ESD protective device of the second type (i.e., NC pin 108 becomes a strong pin), then NC pin 109 will not be coupled to an ESD protective device.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. An integrated circuit package comprising:
   a first weak pin;
   a first strong pin;
   a first NC pin coupled to an ESD protective device, said first NC pin disposed adjacent the first weak pin; and
   a second NC pin disposed adjacent to the first strong pin, said second NC pin not coupled an ESD protective device.

2. The apparatus of claim 1, further including a second strong pin, and wherein the second strong pin is positioned such that it is adjacent the second NC pin, with the second NC pin positioned between the first and second strong pins.

3. The apparatus of claim 1, wherein the first weak pin includes an input pin, and the first strong pin includes a pin selected from a group consisting of: a power pin, an I/O pin, and a NC pin coupled to an ESD protective device.

4. The apparatus of claim 1, wherein the first weak pin includes an I/O pin, and the first strong pin includes a pin selected from a group consisting of: a power pin, an input pin, and a NC pin coupled to an ESD protective device.

5. The apparatus of claim 1, wherein the first weak pin is any pin that is coupled to a first type of ESD protective device, and the first strong pin is any pin that is coupled to a second type of ESD protective device, each of the first and second types of ESD protective devices having an ESD strength rating, with the first type of ESD protective device having a lower ESD strength rating than the second type.

6. An integrated circuit package comprising:
   a first weak pin;
   a first strong pin;
   a first NC pin coupled to an ESD protective device, said first NC pin disposed adjacent the first weak pin;
   a second NC pin disposed adjacent to the first strong pin, said second NC pin not coupled an ESD protective device;
   a second strong pin; and
   a plurality of NC pins that are successively arranged to form an array, wherein the second NC pin is an end NC pin of said array, and with a third NC pin being another end NC pin of said array, with the third NC pin disposed adjacent the second strong pin;
   wherein all the NC pins of said array are not coupled to an ESD protective device.

7. The apparatus of claim 6, wherein the first and second strong pins are both power pins.

8. The apparatus of claim 6, wherein the first and second strong pins are selected from a group consisting of: a power pin, an I/O pin, and an NC pin coupled to an ESD protective device.

9. The apparatus of claim 6, wherein the first weak pin is any pin that is coupled to a first type of ESD protective device, and each strong pin is any pin that is coupled to a second type of ESD protective device, each of the first and second types of ESD protective devices having an ESD strength rating, with the first type of ESD protective device having a lower ESD strength rating than the second type.

10. The apparatus of claim 6, wherein the first strong pin is a NC pin.

11. The apparatus of claim 1, wherein the first strong pin is a wired NC pin.

12. An integrated circuit package comprising:
a first weak pin;
a first strong pin;
a first NC pin coupled to an ESD protective device, said first NC pin disposed adjacent the first weak pin;
a second NC pin disposed adjacent to the first strong pin, said second NC pin not coupled an ESD protective device;
wherein the first weak pin is any pin that is coupled to a first type of ESD protective device, and the first strong pin is any pin that is coupled to a second type of ESD protective device, each of the first and second types of ESD protective devices having an ESD strength rating, with the first type of ESD protective device having a lower ESD strength rating than the second type; and
wherein the first NC pin is coupled to the first type of ESD protective device, and further including a third NC pin positioned adjacent the first NC pin such that the first NC pin is between the first weak pin and the third NC pin, wherein the third NC pin is coupled to an ESD protective device.

13. An integrated circuit package comprising:
a first weak pin;
a first strong pin;
a first NC pin coupled to an ESD protective device, said first NC pin disposed adjacent the first weak pin;
a second NC pin disposed adjacent to the first strong pin, said second NC pin not coupled an ESD protective device;
wherein the first weak pin is any pin that is coupled to a first type of ESD protective device, and the first strong pin is any pin that is coupled to a second type of ESD protective device, each of the first and second types of ESD protective devices having an ESD strength rating, with the first type of ESD protective device having a lower ESD strength rating than the second type; and
wherein the first NC pin is coupled to the first type of ESD protective device, and further including a third NC pin positioned adjacent the first NC pin such that the first NC pin is between the first weak pin and the third NC pin, wherein the first and third NC pins are coupled to the same ESD protective device.

14. An integrated circuit package comprising:
a first weak pin;
a first strong pin;
a first NC pin coupled to an ESD protective device, said first NC pin disposed adjacent the first weak pin;
a second NC pin disposed adjacent to the first strong pin, said second NC pin not coupled an ESD protective device;
further including a second strong pin and a third NC pin, with the third NC pin positioned such that it is adjacent the second NC pin, with the second NC pin positioned between the first strong pin and the third NC pin, and with the second strong pin positioned such that it is adjacent the third NC pin, with the third NC pin positioned between the second strong pin and the second NC pin, wherein the third NC pin is not coupled to an ESD protective device.

15. An integrated circuit package comprising:
a first weak pin;
a first strong pin;
a first NC pin coupled to an ESD protective device, said first NC pin disposed adjacent the first weak pin;
a second NC pin disposed adjacent to the first strong pin, said second NC pin not coupled an ESD protective device;
a second weak pin; and
a plurality of NC pins that are successively arranged to form an array, wherein the first NC pin is an end NC pin of said array, and with a third NC pin being another end NC pin of said array, with the third NC pin disposed adjacent to the second weak pin;
wherein the third NC pin of said array is coupled to an ESD protective device.

16. The apparatus of claim 15, wherein all the NC pins of said array are coupled to an ESD protective device.

17. The apparatus of claim 15, wherein the first and second weak pins are pins that are coupled to a first type of ESD protective device, and the strong pin is any pin that is coupled to a second type of ESD protective device, each of the first and second types of ESD protective devices having an ESD strength rating, with the first type of ESD protective device having a lower ESD strength rating than the second type, wherein the first and third NC pins are coupled to the second type of ESD protective device, with the other NC pins of said array between the first and third NC pins not coupled to an ESD protective device.

18. An integrated circuit package comprising:
a first pin, a second pin, a third pin, and a fourth pin arranged in that order, with the first and second pins adjacent each other, and the third and fourth pins adjacent each other;
wherein the second and third pins are NC pins, the first pin is any pin that is coupled to a first type of ESD protective device, the fourth pin is any pin that is coupled to a second type of ESD protective device, each of the first and second types of ESD protective devices having an ESD strength rating, with the first type of ESD protective device having a lower ESD strength rating than the second type;
wherein the second pin is coupled to an ESD protective device.

19. The apparatus of claim 18, wherein the second pin is coupled to an ESD protective device of the second type, and wherein the third pin is not coupled to an ESD protective device.

20. The apparatus of claim 18, wherein the second pin is coupled to an ESD protective device of the first type, and wherein the third pin is coupled to an ESD protective device.

21. An integrated circuit package comprising:
a first pin, a second pin, a third pin, and a fourth pin arranged in that order, with the first and second pins adjacent each other, and the third and fourth pins adjacent each other;
wherein the second and third pins are NC pins, the first pin is any pin that is coupled to a first type of ESD protective device, the fourth pin is any pin that is coupled to a second type of ESD protective device, each of the first and second types of ESD protective devices having an ESD strength rating, with the first type of ESD protective device having a lower ESD strength rating than the second type;
wherein the second pin is coupled to an ESD protective device; and
a fifth pin that is an NC pin, positioned between and adjacent the second and third pins, and wherein the second pin is coupled to an ESD protective device of the second type, with the third pin is not coupled to an ESD protective device.

22. An integrated circuit package comprising:

a first pin a second pin, a third pin, and a fourth pin arranged in that order, with the first and second pins adjacent each other, and the third and fourth pins adjacent each other;

wherein the second and third pins are NC pins, the first pin is any pin that is coupled to a first type of ESD protective device, the fourth pin is any pin that is coupled to a second type of ESD protective device, each of the first and second types of ESD protective devices having an ESD strength rating, with the first type of ESD protective device having a lower ESD strength rating than the second type;

wherein the second pin is coupled to an ESD protective device; and a fifth pin that is an NC pin, positioned between and adjacent the second and third pins, and wherein the second pin is coupled to an ESD protective device of the first type, with the third and fifth pins each coupled to an ESD protective device.

23. An integrated circuit package comprising:

an array of NC pins having a first end pin and a second end pin, wherein the first end pin is coupled to an ESD protective device and the second end pin is not coupled to an ESD protective device.

24. The apparatus of claim 23, further including a strong pin positioned adjacent the second end pin, and a weak pin positioned adjacent the first end pin.

* * * * *